(12) United States Patent
Yu (10) Patent No.: US 9,516,742 B2
(45) Date of Patent: Dec. 6, 2016

(54) ELECTRIC DEVICE (71) Applicant: POLYTRON TECHNOLOGIES, INC, Taoyuan, Taoyuan County (TW)

(72) Inventor: Sam Yu, Taoyuan (TW)

(73) Assignee: POLYTRON TECHNOLOGIES, INC., Taoyuan, Taoyuan County (TW)

( * ) Notice: Subject to any disclaimer, the term of this patent is extended or adjusted under 35 U.S.C. 154(b) by 689 days.

(21) Appl. No.: 13/794,323

(22) Filed: Mar. 11, 2013

(65) Prior Publication Data
US 2014/0211425 A1      Jul. 31, 2014

(30) Foreign Application Priority Data

Jan. 31, 2013   (TW) .............................. 102202115 U (51) Int. Cl.
*H05K 7/00*      (2006.01)
*H05K 1/02*      (2006.01)

(52) U.S. Cl.
CPC ..... *H05K 1/0274* (2013.01); *H05K 2201/0108* (2013.01); *H05K 2201/0326* (2013.01); *H05K 2201/0329* (2013.01)

(58) Field of Classification Search
USPC ................ 361/749, 782–784, 767, 792–795; 362/12–13, 612–613
See application file for complete search history.

(56) References Cited

U.S. PATENT DOCUMENTS

| | | | | |
|---|---|---|---|---|
| 2007/0105250 A1* | 5/2007 | Daniels | ................... | H01L 24/95 438/22 |
| 2008/0080181 A1* | 4/2008 | Yu | ........................ | H05K 1/0274 362/249.01 |
| 2009/0160819 A1* | 6/2009 | Sasaki | ..................... | B32B 27/00 345/174 |
| 2009/0296389 A1* | 12/2009 | Hsu | ................... | G02F 1/133603 362/235 |
| 2010/0315693 A1* | 12/2010 | Lam | ........................ | G02B 5/23 359/241 |
| 2011/0290304 A1* | 12/2011 | Daniel | .............. | H01L 31/03926 136/251 |
| 2012/0176789 A1* | 7/2012 | Van Herpen | .............. | F21S 4/22 362/234 |

* cited by examiner

*Primary Examiner* — Tuan T Dinh
(74) *Attorney, Agent, or Firm* — Muncy, Geissler, Olds & Lowe, P.C.

(57) ABSTRACT

The present invention discloses an electric device, which comprises at least one transparent/semi-transparent substrate; a plurality of electric conduction elements arranged on at least one of two opposite surfaces and a lateral surface of the transparent/semi-transparent substrate; and at least one module arranged on the transparent/semi-transparent substrate and electrically connected with the electric connection units. The present invention also discloses an electric device, which comprises a plurality of transparent/semi-transparent substrates; a plurality of electric conduction elements selectively arranged on the transparent/semi-transparent substrates; and a plurality of modules arranged on outer surfaces of the transparent/semi-transparent substrates or interposed between the transparent/semi-transparent substrates, and electrically connected with the electric conduction elements. The electric device has electric functions and features transparency esthetics.

11 Claims, 8 Drawing Sheets

ELECTRIC DEVICE

BACKGROUND OF THE INVENTION

Field of the Invention

The present invention relates to an electric device, particularly to an electric device featuring a transparent/semi-transparent structure.

Description of the Related Art

With advance of technology, modern people pursue quality of living and pay more and more attention to esthetics of electronic elements and electronic devices in addition to the performance thereof. The designers of electronic elements and electronic devices normally have to consider the wiring of the power lines and signal lines thereof. Especially, the arrangement and concealment of power lines and signal lines is an important factor for the esthetics of the electronic devices featuring a transparent structure. However, the electronic devices featuring both performance and esthetics in the market still have room to improve.

SUMMARY OF THE INVENTION

One objectives of the present invention is to provide an electric device featuring a transparent/semi-transparent esthetics in addition to the electric performance thereof.

To achieve the abovementioned objective, one embodiment of the present invention proposes an electric device, which comprises at least one first transparent/semi-transparent substrate having two opposite surfaces and a lateral surface; a plurality of first electric conduction elements respectively having different electric polarities and arranged on at least one of the two opposite surfaces and the lateral surface; and at least one first module arranged on the first transparent/semi-transparent substrate and electrically connected with the first electric conduction elements.

Another embodiment of the present invention also proposes an electric device, which comprises a plurality of transparent/semi-transparent substrates each having two opposite surfaces and a lateral surface; a plurality of electric conduction elements respectively having different electric polarities and arranged on at least one of the two opposite surfaces and the lateral surface; a plurality of modules respectively arranged on the transparent/semi-transparent substrates and electrically connected with the electric conduction elements; a plurality of protection layers, wherein some of the protection layers interposed between the transparent/semi-transparent substrates, and wherein the transparent/semi-transparent substrates and the protection layers are stacked up; and a plurality of electric conduction structures electrically connecting the transparent/semi-transparent substrates.

DETAILED DESCRIPTION OF THE INVENTION

According to a first aspect of the present invention, the electric device comprises a first transparent/semi-transparent substrate having two opposite surfaces and a lateral surface; a plurality of first electric conduction elements respectively having different electric polarities and arranged on at least one of the two opposite surfaces and the lateral surface; and at least one first module arranged on the first transparent/semi-transparent substrate and electrically connected with the first electric conduction elements.

In the first aspect of the present invention, the two opposite surfaces and the lateral surfaces of the first transparent/semi-transparent substrate are insulating surfaces. Alternatively, the first transparent/semi-transparent substrate itself is made of an insulating material. In the first aspect of the present invention, the first transparent/semi-transparent substrate is made of a rigid material or a flexible material. In the first aspect of the present invention, the first transparent/semi-transparent substrate is made of a transparent/semi-transparent material, such as glass, PET (Polyethylene terephthalate), PC (polycarbonate), oriented PP (polypropylene), PVC (polyvinylchloride), thermoplastic PU (polyurethane), PE (polyethylene), or acrylate.

In the first aspect of the present invention, the first module is a component selected from a group consisting of resistor elements, capacitor elements, circuit boards, light-emitting elements, chip modules, memory modules, key modules, key elements, display panels, sensors, electroacoustic elements, connector elements, battery modules, electric fan elements, and combinations thereof. In other words, identical or different first modules are selected according to the requirement of the electric device, installed in the first transparent/semi-transparent substrate, and electrically connected with the corresponding first electric conduction elements. The present invention does not constraint that the first modules must be a single type of components. In the present invention, the first modules may include several types of components respectively having different functions. While the first modules include a display panel, the display panel is selected from a group consisting of transparent display panel modules, semi-transparent display panel modules, opaque display panel modules, OLED display panel modules, screen display modules, and combinations thereof.

In the first aspect of the present invention, the first electric conduction elements are selected from a group consisting of transparent electric conduction elements, semi-transparent electric conduction elements, metal wires, and combinations thereof. According to the characteristic of the first modules, the plurality of first electric conduction elements may be divided into at least two different-polarity groups of electric conduction elements, i.e. positive-polarity electric conduction elements and negative-polarity electric conduction elements. The positive-polarity electric conduction elements are converged toward a positive-polarity terminal of an external power source (not shown in the drawings). The negative-polarity electric conduction elements are converged toward a negative-polarity terminal of an external power source (not shown in the drawings). In the first aspect of the present invention, the convergence of the positive-polarity electric conduction elements or negative-polarity electric conduction elements is realized via inserting conventional electric conduction wires through the first transparent/semi-transparent substrate to electrically connect the positive-polarity electric conduction elements or negative-polarity electric conduction elements. However, the present invention does not constraint that the convergence of the electric conduction elements must be realized in the abovementioned way.

In the first aspect of the present invention, the transparent electric conduction element is made of a transparent electric conduction material selected from a group consisting of ITO (Indium Tin Oxide), acrylic transparent electric conduction paste, IZO (Indium Zinc Oxide), ZnO (Zinc Oxide), GZO (Gallium Zinc Oxide), PEDOT (poly(3,4-ethylenedioxythiophene)), metallic nanowires, CNT (carbon nanotube), and other nanomaterials. However, the present invention does not constraint that the transparent electric conduction material must be selected from the abovementioned materials. In the first aspect of the present invention, the metal wires are selected from a group consisting of gold wires, silver wires, copper wires, iron wires, tin wires, aluminum wires and combinations thereof. However, the present invention does not constraint that the metal wires must be selected from the abovementioned wires.

Figure 1:
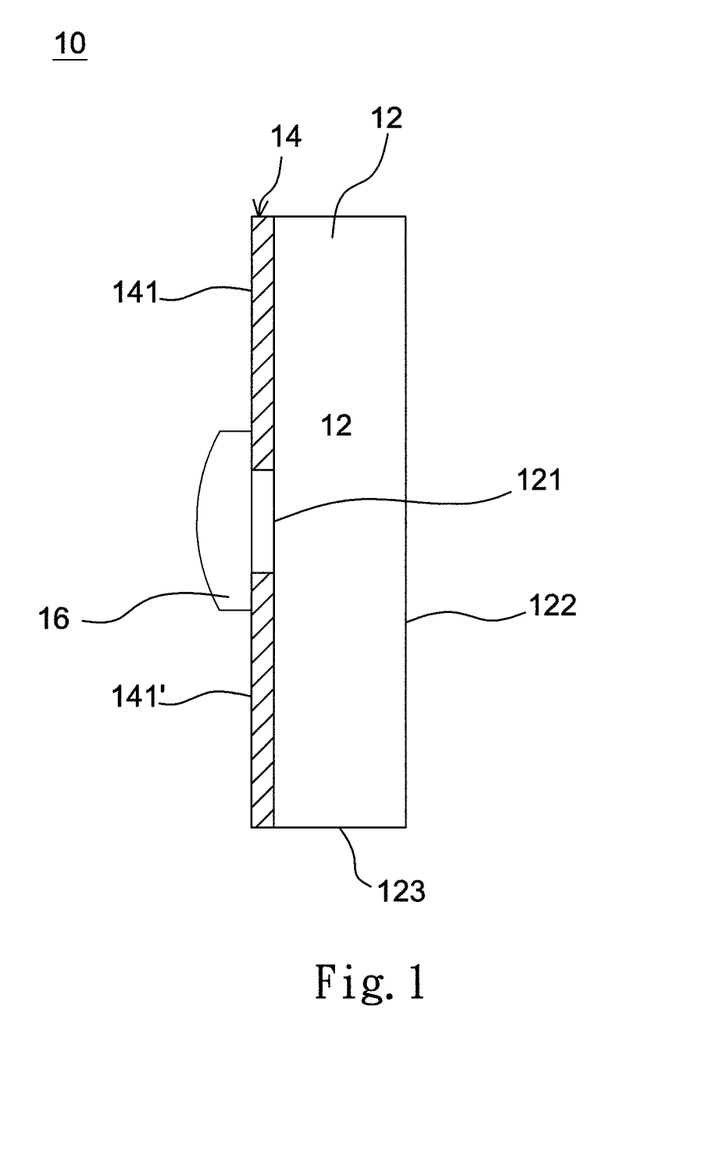
FIG. 1 is a diagram schematically showing the structure of an electric device according to a first embodiment of the present invention.

Refer to FIG. 1 a diagram schematically showing the structure of an electric device according to a first embodiment of the present invention. In the first embodiment, the electric device 10 comprises a first transparent/semi-transparent substrate 12 having a first inner surface 121, a first outer surface 122 opposite to the first inner surface 121, and a first lateral surface 123; a plurality of first electric conduction elements 14 arranged on the first inner surface 121 and mutually electrically separated; and a first module 16 arranged on the first transparent/semi-transparent substrate 12 and electrically connected with the first electric conduction elements 14. In the first embodiment, the first electric conduction elements 14 are two transparent electric conduction elements 141 and 141', which are fabricated via forming a transparent electric conduction film with a sputtering method, a vapor deposition method, a printing method, a coating method, an attaching method or a screen-printing method, and dividing the transparent electric conduction film into the electrically-separated transparent electric conduction elements 141 and 141' with a laser method, a chemical etching method, a printing method or a cutting method. In other words, the transparent electric conduction elements 141 and 141' are electrically insulated. In one embodiment, dyes are diffused into the transparent electric conduction elements 141 and 141' to enhance visual esthetics.

Figure 2:
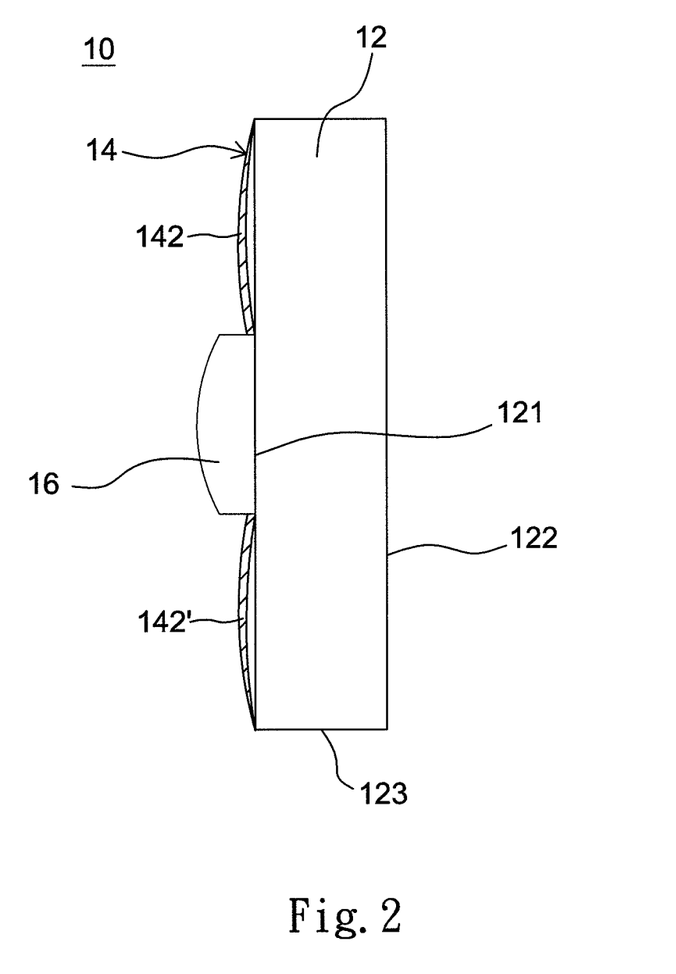
FIG. 2 is a diagram schematically showing the structure of an electric device according to a second embodiment of the present invention.

Refer to FIG. 2 a diagram schematically showing the structure of an electric device according to a second embodiment of the present invention. In the second embodiment, the electric device 10 comprises a first transparent/semi-transparent substrate 12 having a first inner surface 121, a first outer surface 122 opposite to the first inner surface 121, and a first lateral surface 123; and a first module 16 arranged on the first transparent/semi-transparent substrate 12. In the second embodiment, the first electric conduction elements 14 are two metal wires 142 and 142' electrically connected with the first module 16. The design that the first electric conduction elements 14 are realized with metal wires may also be incorporated into the first embodiment.

Figure 3:
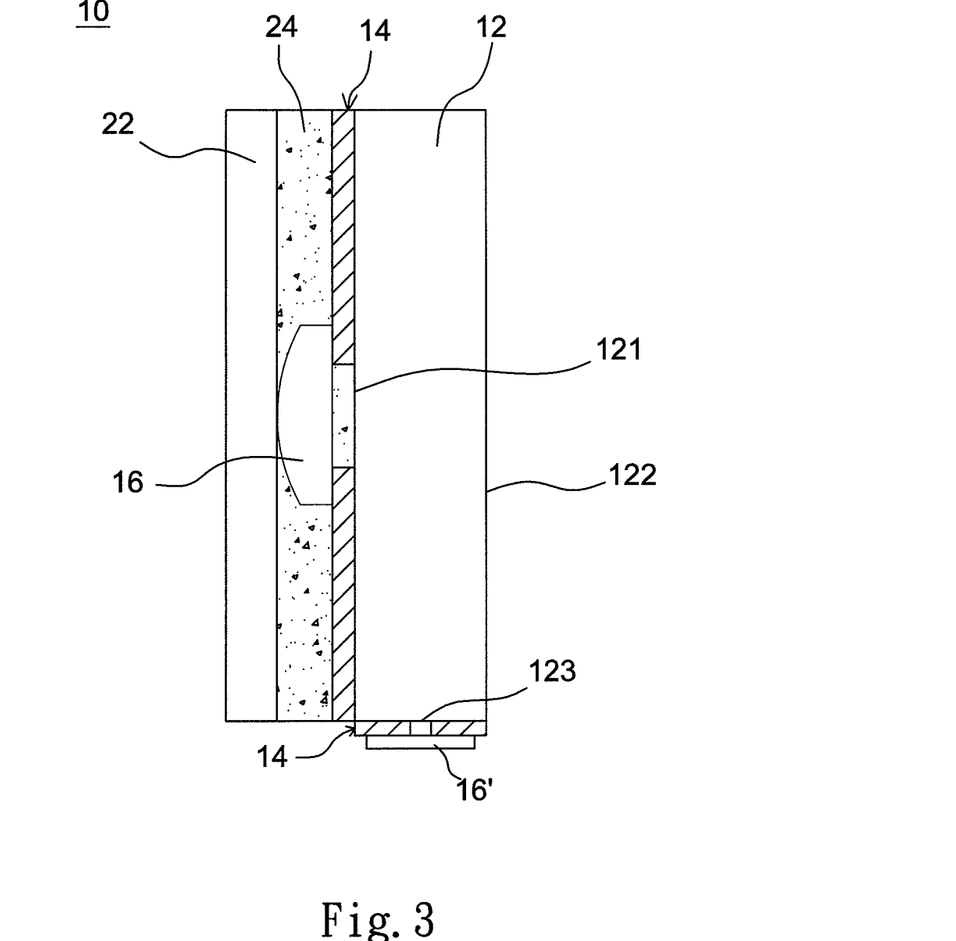
FIG. 3 is a diagram schematically showing the structure of an electric device according to a third embodiment of the present invention.

Refer to FIG. 3 a diagram schematically showing the structure of an electric device according to a third embodiment of the present invention. In the third embodiment, the electric device 10 comprises a first transparent/semi-transparent substrate 12 having a first inner surface 121, a first outer surface 122 opposite to the first inner surface 121, and a first lateral surface 123; and a plurality of first electric conduction elements 14 arranged on the first inner surface 121 and a portion of the first lateral surface 123. In the third embodiment, the portion of the first lateral surface 123 is the bottom surface of the first transparent/semi-transparent substrate 12. In the third embodiment, two first modules 16 and 16' of different functions are respectively electrically connected with the first electric conduction elements 14 separately arranged on the first inner surface 121 and the first lateral surface 123. In the third embodiment, the electric device 10 further comprises a second transparent/semi-transparent substrate 22 parallel spaced from the first transparent/semi-transparent substrate 12, whereby the first module 16 is interposed between the first transparent/semi-transparent substrate 12 and the second transparent/semi-transparent substrate 22. In the third embodiment, the electric device 10 further comprises a transparent/semi-transparent protection layer 24 arranged between the first transparent/semi-transparent substrate 12 and the second transparent/semi-transparent substrate 22. The transparent/semi-transparent protection layer 24 is filled into the gap between the first transparent/semi-transparent substrate 12 and the second transparent/semi-transparent substrate 22 or applied along the perimeter of the gap between the first transparent/semi-transparent substrate 12 and the second transparent/semi-transparent substrate 22.

According to a second aspect of the present invention, the electric device comprises a plurality of transparent/semi-transparent substrates each having two opposite surfaces and a lateral surface; a plurality of electric conduction elements respectively having different electric polarities and arranged on at least one of the two opposite surfaces and the lateral surface; and a plurality of modules respectively arranged on the plurality of transparent/semi-transparent substrates and electrically connected with the electric conduction elements. According to the second aspect, the plurality of modules may have an identical function or respectively have different functions; the modules are not limited to be arranged on the two opposite surfaces or the lateral surface of an identical transparent/semi-transparent substrate; a plurality of transparent/semi-transparent protection layers are respectively arranged between the gaps between the transparent/semi-transparent substrates; the protection layers and the transparent/semi-transparent substrates are stacked up alternately; a plurality of electric conduction structures electrically connects the plurality of transparent/semi-transparent substrates; the protection layers are filled into the gaps between the transparent/semi-transparent substrates or applied along the perimeters of the gaps between the transparent/semi-transparent substrates.

In the second aspect of the present invention, the abovementioned electric conduction structures are electric conduction wires electrically connecting the plurality of transparent/semi-transparent substrates. Alternatively, the abovementioned electric conduction structures are a plurality of electric conduction pillars penetrating the transparent/semi-transparent substrates and electrically connecting the transparent/semi-transparent substrates. In the second aspect of the present invention, the protection layer is made of a material selected from a group consisting of PVB (poly(vinyl butyral), EN (ethylene naphthalate), PEN (polyethylene naphthalate), EVA (ethyl vinyl acetate), PU (polyurethane), thermoplastic PU, UV (ultraviolet)-curable resins, epoxy, and gels. However, the present invention does not constrain that the protection layer must be selected from the abovementioned materials.

In the second aspect of the present invention, the material of the transparent/semi-transparent substrates, the disposition and material of the electric conduction elements, and the adoption of the modules is identical or similar to the material of the first transparent/semi-transparent substrate, the disposition and material of the first electric conduction elements, and the adoption of the first modules and will not repeat herein.

Figure 4:
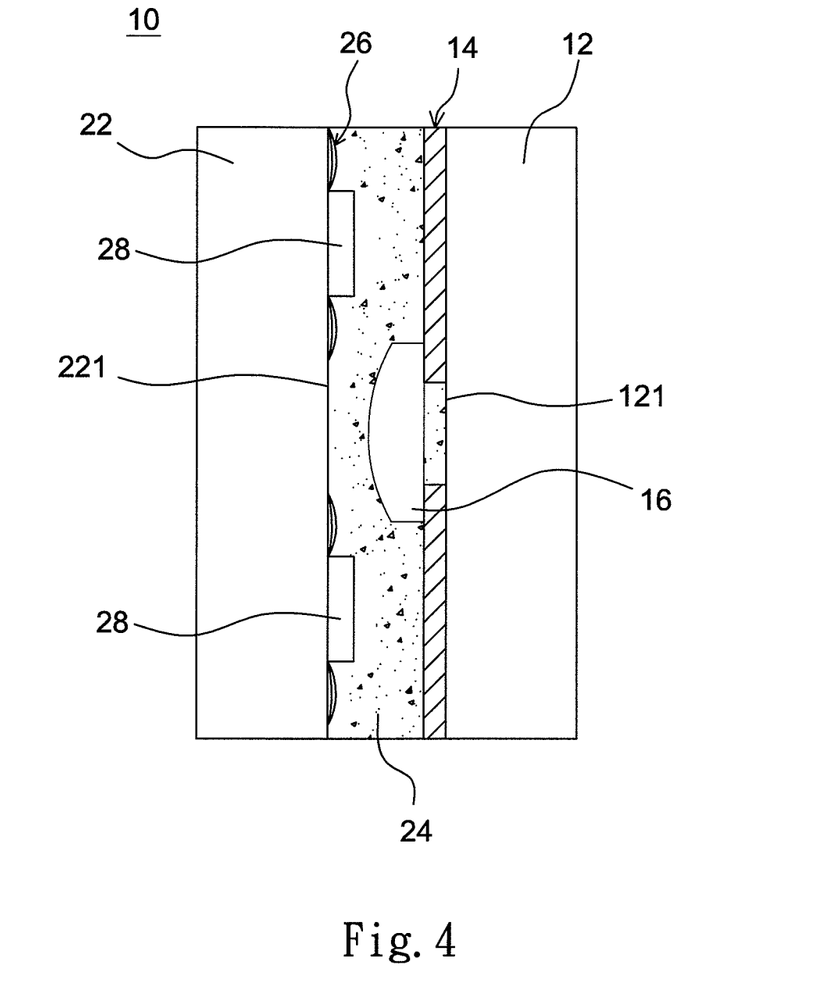
FIG. 4 is a diagram schematically showing the structure of an electric device according to a fourth embodiment of the present invention.

Refer to FIG. 4 a diagram schematically showing the structure of an electric device according to a fourth embodiment of the present invention. In the fourth embodiment, the electric device 10 comprises two transparent/semi-transparent substrates, i.e. a first transparent/semi-transparent substrate 12 and a second transparent/semi-transparent substrate 22 parallel or not parallel to the first transparent/semi-transparent substrate 12 and spaced from the first transparent/semi-transparent substrate 12. The first transparent/semi-transparent substrate 12 has a first inner surface 121, and the second transparent/semi-transparent substrate 22 has a second inner surface 221 facing the first inner surface 121. A plurality of first electric conduction elements 14 is arranged on the first inner surface 121. A plurality of second electric conduction elements 26 is arranged on the second inner surface 221. In the fourth embodiment, the first electric conduction elements 14 on the first inner surface 121 are transparent/semi-transparent electric conduction elements, and a first module 16 is electrically connected with the transparent/semi-transparent electric conduction elements. In the fourth embodiment, the second electric conduction elements 26 on the second inner surface 221 are metal wires, and two identical or different second modules 28 are electrically connected with the metal wires. However, the present invention is not limited by the fourth embodiment. In the present invention, the first electric conduction elements 14 and the second electric conduction elements 26 may be transparent electric conduction elements, semi-transparent electric conduction elements or metal wires simultaneously. In the fourth embodiment, a protection layer 24 is arranged between the first transparent/semi-transparent substrate 12 and the second transparent/semi-transparent substrate 22.

Figure 5:
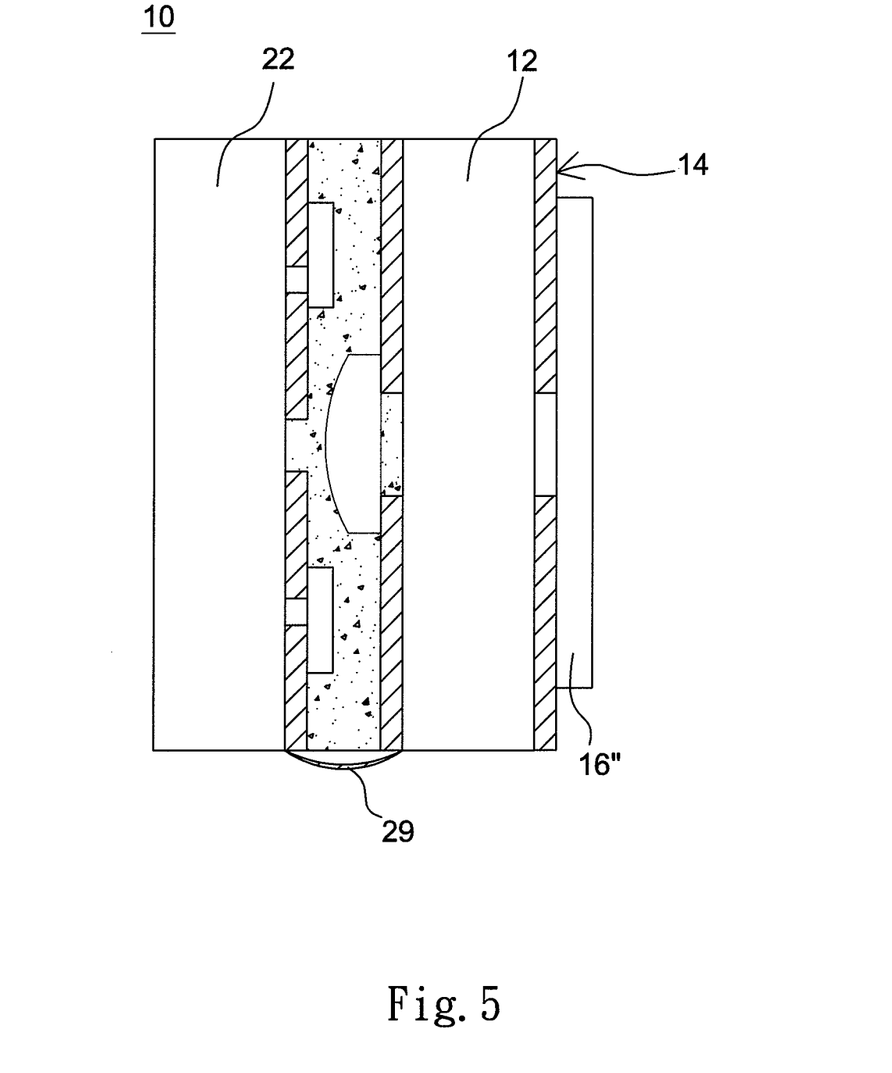
FIG. 5 is a diagram schematically showing the structure of an electric device according to a fifth embodiment of the present invention.

Refer to FIG. 5 a diagram schematically showing the structure of an electric device according to a fifth embodiment of the present invention. The present invention does not constrain that the first electric conduction elements 14 and the second electric conduction elements 26 must be arranged on the inner surfaces. In the fifth embodiment, the first electric conduction elements 14 are also arranged on an outer surface 122 of the first transparent/semi-transparent substrate 12 and electrically connected with another module 16". In the fifth embodiment, the first transparent/semi-transparent substrate 12 and the second transparent/semi-transparent substrate 22 are electrically connected by an electric conduction structure, such as an electric conduction wire 29.

Below are introduced the electric devices respectively adopting different modules to demonstrate the characteristics of the present invention, wherein a first conductive substrate will represent the first transparent/semi-transparent substrate having the first electric conduction elements arranged on the surface or the lateral surface thereof.

Figure 6A:
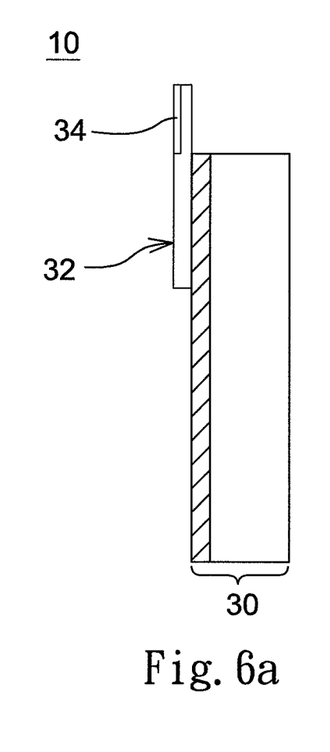
FIG. 6a and FIG. 6b are respectively a sectional view and a top view schematically showing an application of an electric device according to a sixth embodiment of the present invention.
Figure 6B:
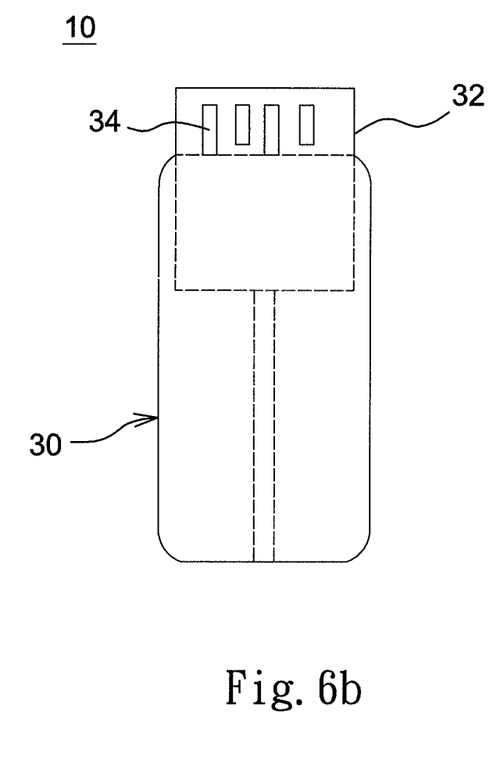

Refer to FIG. 6a and FIG. 6b respectively a sectional view and a top view schematically showing an application of an electric device according to a sixth embodiment of the present invention. In the sixth embodiment, the electric device 10 is applied to a pen driver, wherein the first module includes a memory module 32 arranged on and electrically connected with a first conductive substrate 30. The memory module 32 has a contact terminal, which protrudes from the conductive substrate 30 and will be inserted into a socket for signal and power transmission. However, the present invention is not limited by the sixth embodiment. In another embodiment, the memory module is completely disposed inside the conductive substrate and electrically connected with the conductive substrate. While the user intends to use the pen driver, a portion of the conductive substrate together with the memory module is inserted into the socket. In such a case, the conductive substrate provides more mechanical support for the memory module. In another embodiment, the memory module is a combination of IC (Integrated Circuit), resistors and/or capacitors. The combination is arranged on and electrically connected with the conductive substrate to form a pen driver.

Figure 7A:
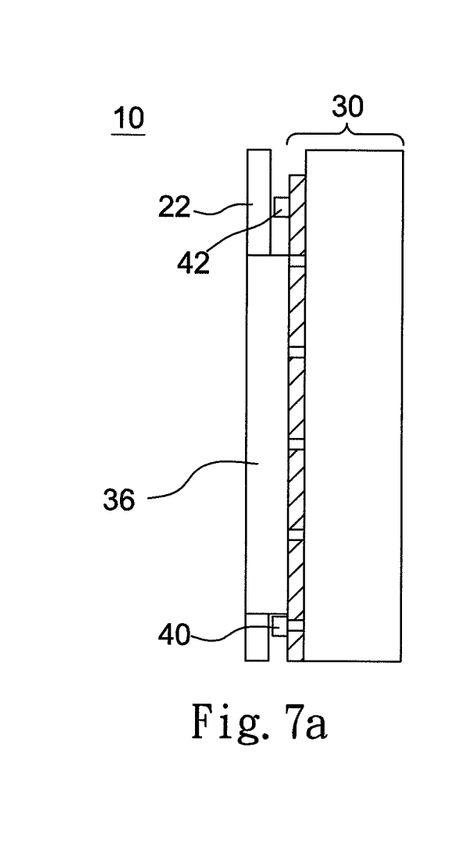
FIG. 7a and FIG. 7b are respectively a sectional view and a top view schematically showing an application of an electric device according to a seventh embodiment of the present invention.
Figure 7B:
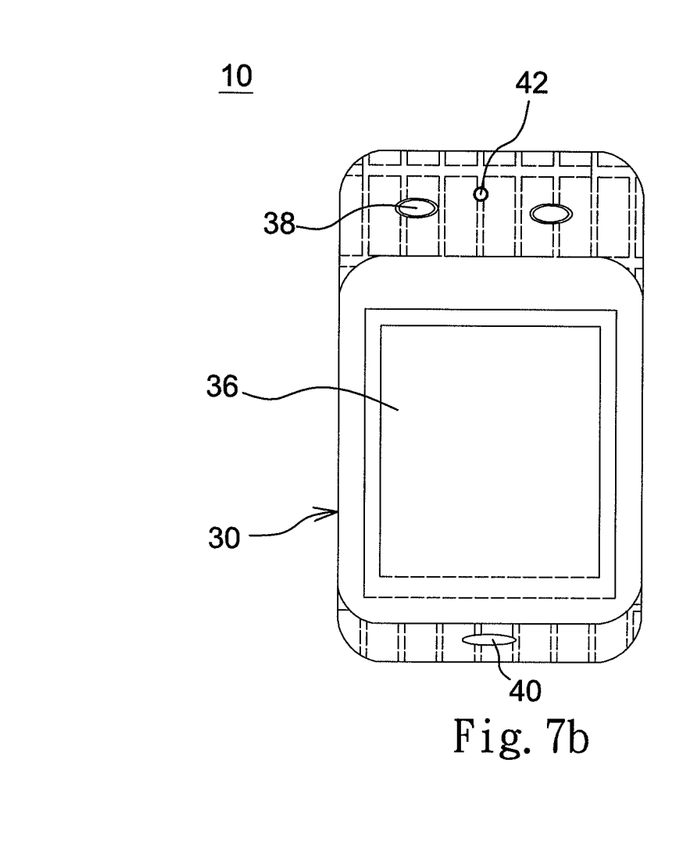

Refer to FIG. 7a and FIG. 7b respectively a sectional view and a top view schematically showing an application of an electric device according to a seventh embodiment of the present invention. In the seventh embodiment, the electric device 10 is applied to a mobile phone, wherein the first module includes a module 36 containing a display panel and a transparent/semi-transparent touch panel. The module 36 is arranged on and electrically connected with a first conductive substrate 30. The electric device 10 further comprises a speaker 38, a microphone 40, an image capture element 42, connector elements (not shown in the drawings), and a second transparent/semi-transparent substrate 22. The second transparent/semi-transparent substrate 22 covers the first module partly or completely and reveals a portion of the components of the first module according to the characteristics of the components to make the user able to listen, talk, capture images, and undertake connection. In one embodiment, the display panel is covered by the touch panel. In another embodiment, a touch panel is directly used as the abovementioned second transparent/semi-transparent substrate, whereby is increased the available area of the touch panel and the utility of the mobile phone.

In one embodiment that the present invention applies to a mobile phone, the first module includes a display panel, a speaker, a microphone, an image capture element, chips, memories, keys, sensors, resistors, capacitors, circuit boards, and connectors. The first module is not limited to be arranged on the first conductive substrate. A portion of the first module may also be arranged on the surface of the second transparent/semi-transparent substrate having the second electric conduction elements or the peripheral surfaces thereof. The first electric conduction elements and/or the second electric conduction elements are respectively converged toward different external electric modules (not shown in the drawings) according to the components they connect with to enable the operations of the electric modules. Besides, a transparent/semi-transparent protection layer is filled into the gap between the first transparent/semi-transparent substrate and the second transparent/semi-transparent substrate.

Figure 8:
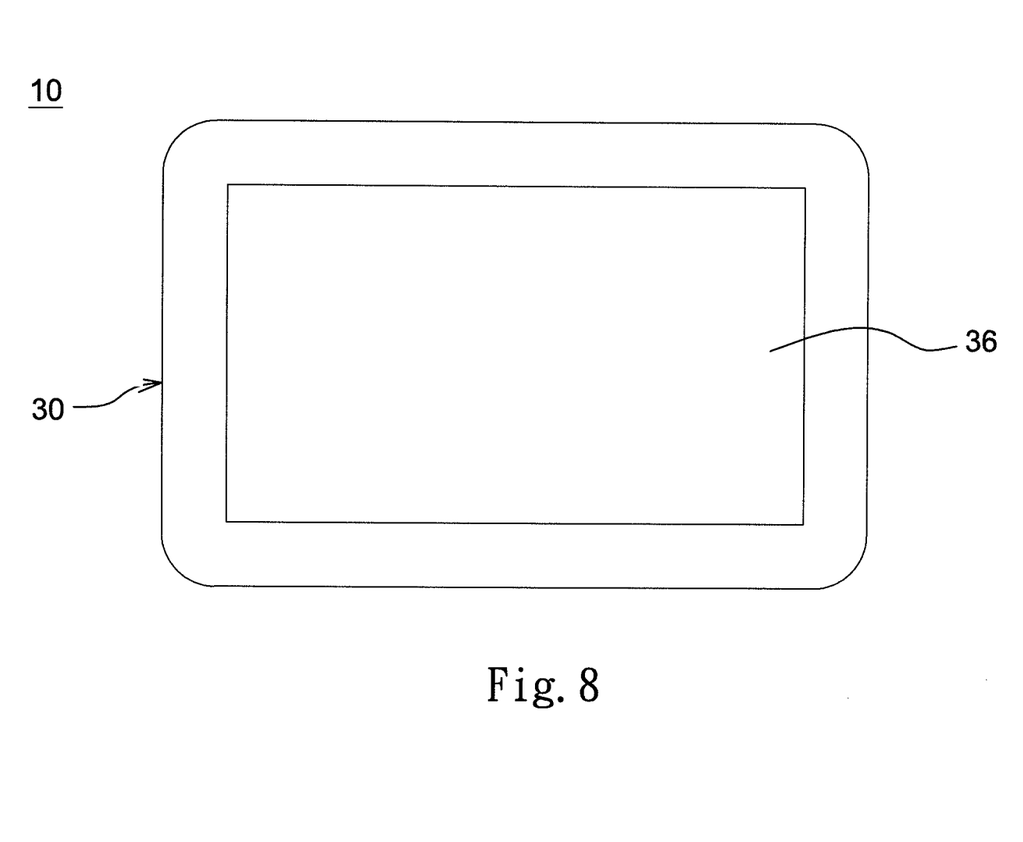
FIG. 8 is a diagram schematically showing an application of an electric device according to an eighth embodiment of the present invention.

Refer to FIG. 8 a diagram schematically showing an application of an electric device according to an eighth embodiment of the present invention. In the eighth embodiment, the electric device 10 is applied to a tablet computer. Similar to the embodiment of mobile phones, a display panel 36, which is covered by a touch panel, is arranged on and electrically connected with a first conductive substrate 30. The components of the tablet computer, such as a speaker, a microphone, an image capturing element, connectors, chips, memories, keys, sensors, light emitting elements, resistors, capacitors and circuit boards, are arranged on the surface of the first conductive substrate or the peripheral surfaces thereof, and electrically connected with the first conductive substrate according to requirements.

In conclusion, the present invention arranges a plurality of electric conduction elements on a transparent/semi-transparent substrate and electrically separates the electric conduction elements. Thereby, the present invention can apply to electric products in many fields, providing not only electric functions but also transparency esthetics for products.

What is claimed is:

1. An electric device comprising:
    a first transparent/semi-transparent substrate and a second transparent/semi-transparent substrate spaced from said first transparent/semi-transparent substrate, wherein said first transparent/semi-transparent substrate has a first inner surface and said second transparent/semi\-transparent substrate has a second inner surface facing said first inner surface;
    a plurality of first electric conduction elements arranged on said first inner surface, said second inner surface and an outer surface of said first transparent/semi-transparent substrate, wherein said plurality of first electric conduction elements have different electric polarities;
    a plurality of modules respectively arranged on said first transparent/semi-transparent substrate and said second transparent/semi-transparent substrate, and electrically connected with said first electric conduction elements;
    a plurality of protection layers partially arranged between said first inner surface and said second inner surface, wherein said first transparent/semi-transparent substrate, said second transparent/semi-transparent substrate and said protection layers are stacked up; and
    a plurality of electric conduction structures are electrically connected to the first electric conduction elements formed in the first and second inner surfaces of said first transparent/semi-transparent substrate and said second transparent/semi-transparent substrate.

2. The electric device according to claim 1, wherein said first transparent/semi-transparent substrate and said second transparent/semi-transparent substrate are rigid substrates or flexible substrates.

3. The electric device according to claim 1, wherein said protection layers cover said modules, or wherein said protection layers enclose gaps between said first transparent/semi-transparent substrate and said second transparent/semi-transparent substrate, or wherein a portion of said protection layers cover said modules, and a portion of said protection layers enclose gaps between said first transparent/semi-transparent substrates and said second transparent/semi-transparent substrate.

4. The electric device according to claim 1, wherein said first transparent/semi-transparent substrate and said second transparent/semi-transparent substrate are made of a material independently selected one from a group consisting of glass, PET (Polyethylene terephthalate), PC (polycarbonate), oriented PP (polypropylene), PVC (polyvinylchloride), thermoplastic PU (polyurethane), PE (polyethylene), acrylate, transparent plastic materials, and semi-transparent plastic materials.

5. The electric device according to claim 1, wherein each said first electric conduction element is independently selected at least one from a group consisting of transparent electric conduction elements, semi-transparent electric conduction elements, and metal wires.

6. The electric device according to claim 1, wherein each said module is independently selected at least one from a group consisting of light-emitting elements, chip modules, memory modules, key modules, display panels, sensors, electroacoustic elements, connector elements, key elements, battery modules, resistor elements, capacitor elements, circuit boards and electric fan elements.

7. The electric device according to claim 1, wherein said electric conduction structures are electric conduction wires connecting said first transparent/semi-transparent substrate and said second transparent/semi-transparent substrate.

8. The electric device according to claim 1, wherein said electric conduction structures include a plurality of electric conduction pillars penetrating said first transparent/semi-transparent substrates and said second transparent/semi-transparent substrate and electrically connecting said first transparent/semi-transparent substrate and said second transparent/semi-transparent substrate.

9. The electric device according to claim 5, wherein each said metal wire is independently selected at least one from a group consisting of gold wires, silver wires, copper wires, iron wires, tin wires, and aluminum wires.

10. The electric device according to claim 5, wherein each said transparent electric conduction element or each said semi-transparent electric conduction element is made of a material selected independently at least one from a group consisting of ITO (Indium Tin Oxide), acrylic transparent electric conduction paste, IZO (Indium Zinc Oxide), ZnO (Zinc Oxide), GZO (Gallium Zinc Oxide), PEDOT (poly(3, 4-ethylenedioxythiophene)), metallic nanowires, CNT (carbon nanotube), nanomaterials, transparent electric conduction materials, and semi-transparent electric conduction materials.

11. The electric device according to claim 6, wherein each of said display panels is independently selected at least one from a group consisting of transparent display panel modules, semi-transparent display panel modules, opaque display panel modules, OLED display panel modules, and screen display modules.

* * * * *